United States Patent
Dore et al.

(10) Patent No.: US 8,161,350 B2
(45) Date of Patent: Apr. 17, 2012

(54) METHOD AND SYSTEM FOR ENCODING A DATA SEQUENCE

(75) Inventors: Jean-Baptiste Dore, Cesson Sevigne (FR); Marie-Hélène Hamon, Noyal sur Vilaine (FR); Pierre Penard, Rennes (FR)

(73) Assignee: France Telecom, Paris (FR)

( * ) Notice: Subject to any disclaimer, the term of this patent is extended or adjusted under 35 U.S.C. 154(b) by 684 days.

(21) Appl. No.: 11/988,252

(22) PCT Filed: Jun. 30, 2006

(86) PCT No.: PCT/FR2006/050653
§ 371 (c)(1),
(2), (4) Date: Mar. 4, 2009

(87) PCT Pub. No.: WO2007/003855
PCT Pub. Date: Jan. 11, 2007

(65) Prior Publication Data
US 2009/0217123 A1    Aug. 27, 2009

(30) Foreign Application Priority Data
Jul. 1, 2005  (FR) ...................................... 05 07007

(51) Int. Cl.
*H03M 13/00*    (2006.01)

(52) U.S. Cl. ........................ 714/758; 714/752
(58) Field of Classification Search .................. 714/752, 714/758
See application file for complete search history.

(56) References Cited

U.S. PATENT DOCUMENTS

| | | | | |
|---|---|---|---|---|
| 7,516,391 | B2 * | 4/2009 | Kyung et al. | 714/758 |
| 7,752,521 | B2 * | 7/2010 | Livshitz | 714/752 |
| 7,930,622 | B2 * | 4/2011 | Oh et al. | 714/801 |
| 2009/0217122 | A1 * | 8/2009 | Yokokawa et al. | 714/752 |

FOREIGN PATENT DOCUMENTS
EP    1531552 A    5/2005

OTHER PUBLICATIONS

Echard et al., "The PI-Rotation Low-Density Parity Check Codes", 2001 IEEE Global Telecommunications Conference, San Antonio, TX, Nov. 25-29, 2001, IEEE Global Telecommunications Conf., New York, NY, vol. 2 of 6, Nov. 25, 2001, pp. 980-984.
Yu Yi et al., "The Semi-Algebra Low-Density Parity-Check Codes", 2004 IEEE International Conference on Paris, France Jun. 20-24, 2004, Piscataway, NJ USA, pp. 440-443.

(Continued)

*Primary Examiner* — Sam Rizk
(74) *Attorney, Agent, or Firm* — Cozen O'Connor

(57) ABSTRACT

A communication method and a communication system including a first entity (3) including an information source (9) and a coder device (11) connected by a channel (7) transmitting data to a second entity (5) including a decoder device (13), the coder device (11) coding a data sequence sent by the information source (9) to form a set of code words from a parity check matrix including two matrix areas, each matrix area including a processing matrix, a connecting matrix including only one "1" per column and only one "1" per row, and a triangular matrix, and the decoder device (13) decoding a coded reception signal that is received by the second entity and is derived from the set of code words constructed in accordance with said parity check matrix.

20 Claims, 5 Drawing Sheets

OTHER PUBLICATIONS

Echard et al., "Deterministic PI-rotation low-density parity check codes", Electronics Letters, IEE Stevenage, GB, vol. 38, No. 10, May 9, 2002, pp. 464-465.

Echard et al., "Irregular PI-Rotation LDPC Codes", IEEE Global Telecommunications Conference Proceedings, Taipei, Taiwan Nov. 17-21, 2002, IEEE Global Telecommunications Conference, New York, NY, vol. 1 of 3, Nov. 17, 2002, pp. 1274-1278.

Yang, et al., "Design of Efficiently Encodable Moderate-Length High-Rate Irregular LDPC Codes", IEEE Transactions on Communications, IEEE Service Center, Piscataway NJ, vol. 52, No. 4, Apr. 4, 2004, pp. 564-571.

Xiao-Yu Hu, et al., "On the Computation of the Minimum Distance of Low-Density Parity-Check Codes", Communications, 2004, Piscataway, NJ, IEEE, Jun. 20, 2004, pp. 767-771.

Yifei Zhang, et al., "Structured eIRA Codes", Signals, Systems and Computers, 2004. Conference Record of the Thirty-Eighth Asilomar Conference on Pacific Grove, CA. Nov. 7-10, 2004, Piscataway, NJ, IEEE Nov. 7, 2004, pp. 2005-2009.

Png K., et al., "Performance Studies of a Multi-Band OFDM System Using a Simplified LDPC Code", Ultra Wideband systems, 2004. Joint with Conference on Ultrawideband Systems and Technologies. Joint UWBST & IWUWBS. 2004 Int'l. Workshop on Kyoto, Japan, May 18-21, 2004, Piscataway, NJ, IEEE, May 18-21, 2004, pp. 376-380.

Johnson et al., "Quasi-cyclic LDPC codes from difference families", $3^{rd}$ AusCTW, Canberra, Australia, Feb. 4-5, 2002 (total pages 5).

Fossorier, "Quasi-Cyclic Low-Density Parity-Check Codes From Circulant Permutation Matrices", IEEE Transaction on Information Theory, vol. 50, No. 8, Aug. 2004, pp. 1788-1793.

\* cited by examiner

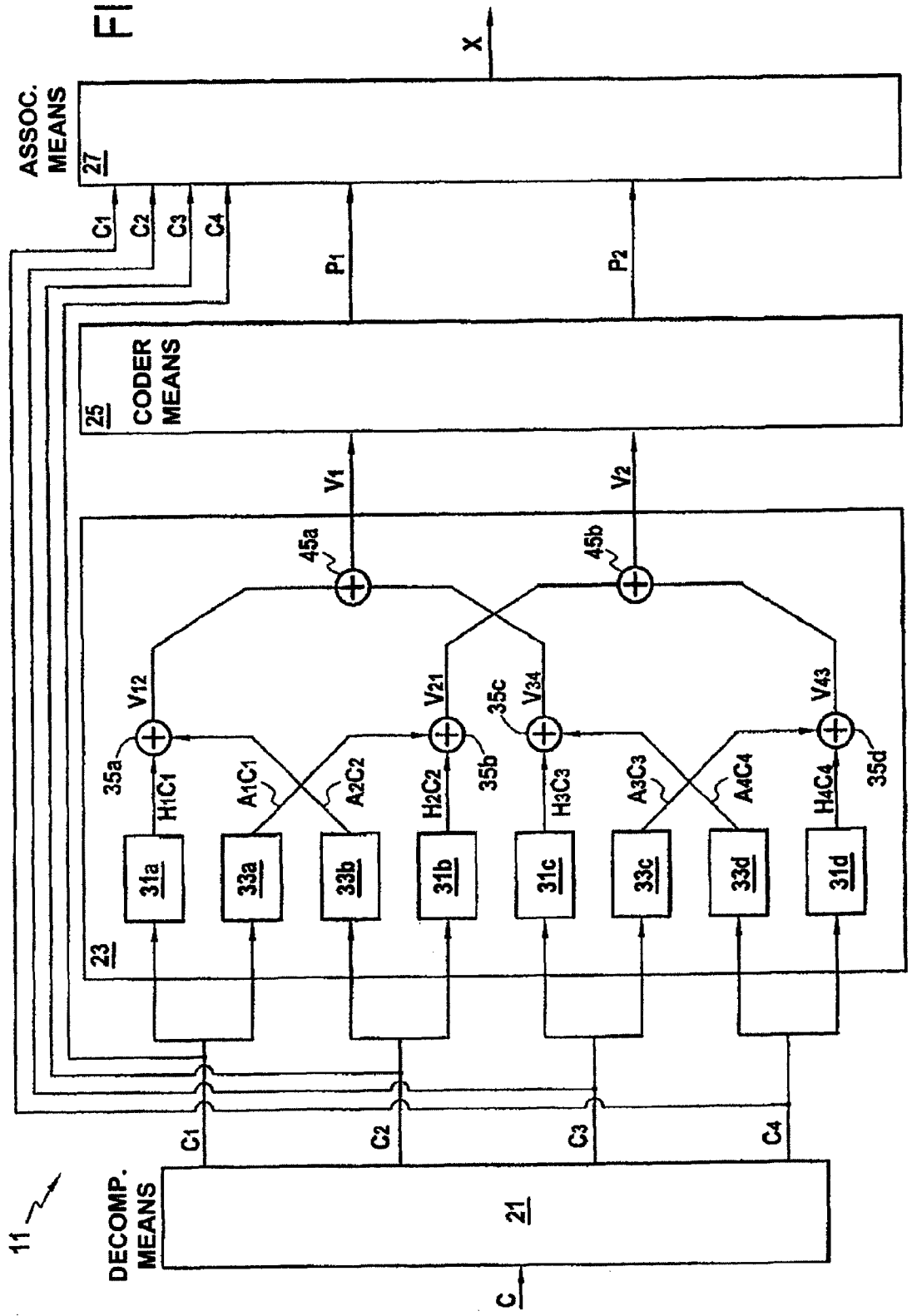

METHOD AND SYSTEM FOR ENCODING A DATA SEQUENCE

RELATED APPLICATIONS

This is a U.S. National Phase Application under 35 USC 371 of International Application No. PCT/FR2006/050653, filed on 30 Jun. 2006.

This patent application claims priority of French patent application No. 0507007 filed 1 Jul. 2005, the disclosure content of which is hereby incorporated by reference.

TECHNICAL FIELD OF THE INVENTION

The invention relates to the field of digital communications, to a method of constructing an LDPC code for coding and decoding a data sequence, and to coder and decoder devices.

BACKGROUND OF THE INVENTION

At present, in digital communication systems offering the highest performance, the data is protected by high-performance channel coding and is decoded iteratively by a weighted output decoder.

In the field of digital transmission, and more particularly when the transmission channel is a radio channel, the main function of these corrector codes is to resolve ambiguities in the transmitted message introduced by the transmission channel. The performance enhancement achieved by these codes can be to reduce the power consumption of the terminals or to increase the volume of information transmitted.

Considerable research has been done recently in the field of coding and decoding using corrector codes known as LDPC (low density parity check) codes. LDPC codes are proposed, for example, in the context of the IEEE 802.11n high-throughput WLAN standards and have also been adopted in the IEEE 802.16.e (mobile WiMax) standard.

Many channel coding techniques use LDPC codes. However, the major drawback of LDPC codes is their coding complexity. A number of LDPC code families nevertheless simplify the coding process. All these codes share a triangular parity check matrix H. Also, it has been shown that for block sizes of the order of a few kilobits deterministic or pseudo-deterministic constructions of the parity check matrices defining an LDPC code offer better performance than random constructions.

Below, N denotes the size of a code word x made up of M parity bits forming the parity vector P and K information or data bits forming the data vector C. The yield R of the code is given by the following formula:

$$R = \frac{K}{N}$$

The parity check matrix H of the code is an M×N matrix, each parity equation is made up of $d_c$ variables, and each variable is connected to $d_v$ equations. Also, a code is referred to as regular if each variable is connected to the same number of equations and if each equation has the same number of variables, which corresponds to a parity check matrix including the same number of "1s" per row and the same number of "1s" per column.

Also, this parity check matrix H can be defined by two submatrices such that:

$$H=[H_1 H_p]$$

where $H_p$ is an M×M square matrix associated with the parity bits of the parity vector P and $H_1$ is an M×K matrix associated with the information bits of the data vector C. Thus a word x decomposed into information bits and parity bits in the following manner x=[C P] is a code word if and only if:

$$Hx^T = [H_1 \; H_p]\begin{bmatrix}C^T \\ P^T\end{bmatrix} = 0^T$$

$x^T$, $C^T$ and $P^T$ being the transposed vectors of the vectors x, C, and P. Moreover, the projection vector V is the vector defined by the equation:

$$V^T = H_1 C^T$$

The document by Michael Yang, W. E. Ryan, and Yan Li, "Design of efficiently encodable moderate-length high-rate irregular LDPC codes" (IEEE Transactions on Communications, April 2004) describes the construction of an LDPC code by a parity check matrix of the form H=[$H_1$ $H_p$]. This matrix H is pseudodeterministic and provides fast calculation of the redundancy bits. The matrix $H_1$ is generated randomly and the matrix $H_p$ is a diagonal matrix. The parity bits of the parity vector P are calculated from information bits of the data vector C using the following equation:

$$P = H_p^{-1} H_1 C$$

Because of the triangular shape of matrix $H_p$, its inverse $H_p^{-1}$ has a particularly beneficial shape that enables simple calculation of the parity bits from the product $H_1 C$.

In fact, FIG. 10 is a diagram showing a coder device including control means 131 and coder means 125 reflecting calculation of the parity bits using the equation $P = H_p^{-1} H_1 C$.

However, despite the pseudodeterministic character of code constructed from matrices of this type, the parity check matrix H is structured at a very low level. The lack of structure of the randomly generated matrix $H_1$ makes the calculation of the product $H_1 C$ very complex. Also, in this configuration, it is necessary to store the matrix $H_1$ on sending, which is very costly from the practical implementation point of view.

To simplify the calculation, S. J. Johnson and S. R. Weller, in their publication "Quasi-cyclic LDPC codes from differences families" (3rd Australian Communications Theory Workshop, Canberra, Australia, February 2002), propose a code constructed from a deterministic and quasicyclic parity check matrix.

This matrix H is decomposed into submatrices. Each submatrix is an identity matrix having its columns circularly permutated k times to the left or to the right. This form of matrix simplifies setting LDPC code parameters. This structure also reduces coding complexity.

Similarly, R. Echard and S-C Chang, in their publication "The pi rotation Low Density Parity Check Codes" (GLOBECOM 2001, November 2001, pp. 980-984), propose a code constructed from a deterministic parity check matrix using a pi-rotation matrix technique. This parity check matrix H is divided into two submatrices $H_\pi$ and $H_p$ such that H=[$H_\pi$ $H_p$] where $H_p$ is a bidiagonal matrix. The originality of this construction comes from the shape of the matrix $H_\pi$, which enables fast calculation at relatively low cost from the point of view of implementing the product $H_\pi C$.

The codes generated from deterministic matrices of quasi-cyclic or pi-rotation type are structured, which reduces coding complexity. However, this kind of matrix generates codes having a low minimum distance. In particular, for a given number of "1" per column, the minimum distance does not increase with the block size. These codes can therefore degrade performance for low error rates, given that the minimum distance is directly linked to the performance of a code.

OBJECT AND SUMMARY OF THE INVENTION

An object of the invention is to remove these drawbacks and to simplify the coding process.

That object is achieved by a method of constructing of an LDPC code by means of a parity check matrix, each column of said parity check matrix defining a determined number of coded bits and each row defining a parity equation, characterized in that said parity check matrix includes at least two matrix areas, each matrix area including a processing matrix, a connection matrix having only one "1" per column and only "1" per row, and a triangular matrix.

The parity check matrix is therefore a structured matrix that simplifies the coding process at the same time as generating codes having a minimum distance that is sufficiently large to achieve good performance.

Another aspect of the invention is directed to a method of coding a data sequence in accordance with an LDPC code defined by the parity check matrix, including the following steps:
decomposing the data sequence into a set of data vectors including a determined number of data vectors;
determining of parity vectors corresponding to the data vectors satisfying the set of parity equations defined by said parity check matrix; and
associating the set of data vectors with the parity vectors to form a code word including a plurality of data bits and a plurality of parity bits.

A data sequence is therefore coded with reduced complexity on the basis of the parity check matrix.

The determination of said parity vectors includes the following steps:
transforming said set of data vectors into projection vectors by means of a set of projections in parallel; and
multiplying each of the projection vectors by the inverse of a triangular matrix of said parity check matrix to form said parity vectors.

The parallel processing of the data vector therefore increases the coding speed and consequently increases the coded word throughput.

When the determined number of data vectors is two, said parallel projection transformation step includes the following steps:
carrying out operations in parallel including control and permutation operations on said two data vectors to form two control vectors and two permutation vectors; and
adding said two control vectors to said two permutation vectors to form a set of projection vectors consisting of said two projection vectors so that a control vector at the exit from an operation of checking a data vector is added to a permutation vector at the exit from an operation of permutating the other data vector.

This enables mixing of different codes coded in parallel to obtain a high level of performance without unduly increasing the complexity of the coding process.

Moreover, when the determined number of data vectors is greater than two, said parallel projection transformation step includes the following steps:
carrying out operations in parallel including control and permutation operations on said set of data vectors to form a set of control vectors and a set of permutation vectors;
adding said set of control vectors to said set of permutation vectors to form a set of projection vectors such that a control vector at the exit from an operation of checking any data vector is added to a permutation vector at the exit from an operation of permutating another data vector;
adding the projection vectors of said set of projection vectors two by two to form another set of projection vectors, the addition being effected between two projection vectors that do not depend on the same data vectors; and
if the other set of projection vectors includes more than two projection vectors, then repeating the previous step until said two projection vectors are obtained.

This enables mixing of different codes coded in parallel to improve performance.

Each permutation vector of said set of permutation vectors is used only once during the formation of said set of projection vectors.

This optimizes parallel processing and increases the mixing, improving coding performance.

Said control information advantageously includes multiplying each data vector by a processing matrix of said parity check matrix and said permutation operation advantageously includes multiplying each data vector by a connecting matrix of said parity check matrix.

The structures of the connecting and processing matrices therefore reduce complexity at the same time as simplifying coding.

The connection matrices of said parity check matrix can be identical. This reduces the amount of data to be stored, thereby facilitating the coding process.

Said connection matrices can advantageously be identity matrices, thus further reducing the amount of data to be stored.

According to one embodiment of the present invention, the triangular matrix is a bidiagonal matrix having two diagonals of "1" spaced by a given number n of diagonals of "0".

This type of parity matrix can therefore be inverted and produces parity bits simply and quickly.

The coding method can advantageously further include a step of puncturing the parity bits of said code word. Puncturing widens the range of yields of the code.

Another aspect of the invention is directed to a method of decoding a reception signal including coded bits, said reception signal being derived from a set of code words coded in accordance with the LDPC code constructed in accordance with the parity check matrix, including the following steps:
solving each of said parity equations associated with said parity check matrix to calculate probabilistic estimates of the values of decoded bits in each of said parity equations;
sending said probabilistic estimates to the set of coded bits in each of said parity equations;
calculating for each coded bit a new probabilistic estimate from the probabilistic estimates obtained from the parity equations associated with each coded bit;
updating the probabilistic estimates at the level of the parity equations; and
reiterating the above steps until a predetermined stop condition is satisfied.

Decoding is therefore effected iteratively on the basis of the parity check matrix.

The predetermined stop condition can be defined by a determined number of iterations and/or by the decoding process converging toward a code word.

Decoding speed or performance can therefore be improved, depending on the stop condition chosen.

Another aspect of the invention is directed to a communication system including a first entity comprising an information source and a coder device connected via a data transmission channel to a second entity including a decoder device, the coder device coding a data sequence sent by the information source to form a set of code words from a parity check matrix including two matrix areas, each matrix area including a processing matrix, a connecting matrix including only one "1" per column and only one. "1" per row, and a triangular matrix and the decoder device decodes a coded reception signal received by the second entity, said coded reception signal being obtained from the set of code words constructed in accordance with said parity check matrix.

Another aspect of the invention is directed to a device for coding a data sequence, including:
  means for decomposing the data sequence into a set of data vectors including a determined number of data vectors;
  transformation means for transforming said set of data vectors into projection vectors by means of a set of projections in parallel;
  coder means for multiplying each of the projection vectors by the inverse of said triangular matrix of said parity check matrix to form two parity vectors; and
  association means for associating the set of data vectors with said parity vectors to form a code word including a plurality of data bits and a plurality of parity bits.

The coder device therefore features a simple implementation of code word generation.

When the determined number of data vectors is two, the transformation means include:
  control means for multiplying in parallel each of the two data vectors by a processing matrix of said parity check matrix forming two control vectors;
  permutation means for multiplying in parallel each of the two data vectors by a connecting matrix of said parity check matrix forming two permutation vectors; and
  addition means for adding said two control vectors to said two permutation vectors to form said two projection vectors such that a control vector at the output of control means acting on a data vector is added to a permutation vector at the output of a permutation means acting on the other data vector.

Moreover, when the determined number of data vectors is greater than two, the transformation means include:
  control means for multiplying in parallel each data vector by a processing matrix of said parity check matrix forming a set of control vectors;
  permutation means for multiplying in parallel each data vector by a connecting matrix of said parity check matrix forming a set of permutation vectors;
  first addition means for adding said set of control vectors to said set of permutation vectors to form a set of projection vectors such that a control vector at the output of control means acting on any data vector is added to a permutation vector at the output of permutation means acting on another data vector; and
  second addition means for successively adding the projection vectors from the set of projection vectors two by two until two projection vectors are obtained.

The device therefore performs calculation in parallel, increasing the code word throughput.

Another aspect of the invention is directed to a device for decoding a reception signal including coded bits, said reception signal being obtained from a set of code words constructed in accordance with the parity check matrix, the device including:
  processor means for solving each of said parity equations associated with said parity check matrix to calculate probabilistic estimates of the values of decoded bits in each of said parity equations;
  parity check modules each iteratively processing decoded bits and communicating with the other modules to exchange the probabilistic estimates enabling the processor means to calculate a new probabilistic estimate on each iteration and for each coded bit until a predetermined stop condition is satisfied.

The decoder device therefore effects fast and very reliable decoding.

Another aspect of the invention is directed to a computer program executed in a data processing system and including instructions necessary for implementing the above coding method.

Another aspect of the invention is directed to a computer program executed in a data processing system and including instructions necessary for implementing the above decoding method.

BRIEF DESCRIPTION OF THE DRAWINGS

Other features and advantages of the invention emerge on reading the description given below by way of non-limiting illustration and with reference to the appended drawings, in which:

FIG. 8 is a diagram showing a FIG. 2 coder device from in which the determined number of data vectors is four;

DETAILED DESCRIPTION OF THE DRAWINGS

Figure 1:
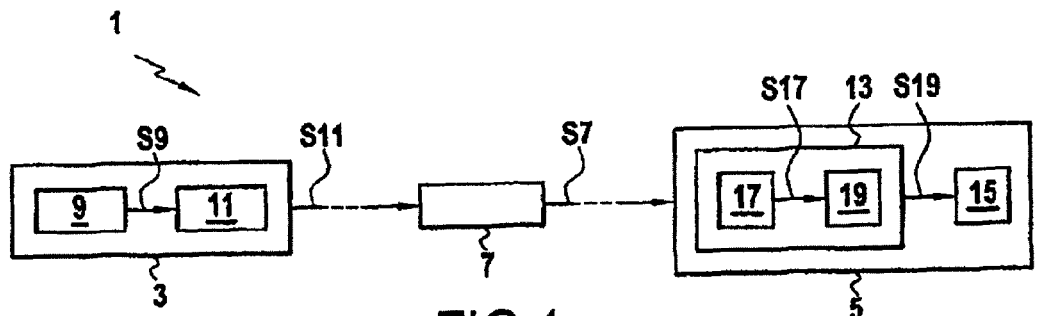
FIG. 1 is a diagram showing a communication system according to the invention including at least two entities interconnected by a data transmission channel.

FIG. 1 is a diagram showing one example of a communication system 1 according to the invention including at least two entities 3 and 5 interconnected by a data transmission channel 7.

The example shown in this figure includes a first entity 3 that includes an information source 9 and a coder device 11. The first entity 3 is connected by the data transmission channel 7 to the second entity 5, which includes a decoder device 13 and an information receiver 15.

The information source 9 delivers an information signal S9 including a set of data sequences C. The coder device 11 delivers a coded transmission signal S11 including a set of code words {x} corresponding to coding of all the data sequences. Each code word x being an association of data vectors $C_i$ including data bits and parity vectors $P_i$ including parity bits $p_j$.

In fact, the coder device 11 codes each data sequence of the information signal S9 sent by the information source 9 to form a code word x in accordance with an LDPC code generated from a parity check matrix H. This parity check matrix H includes two matrix areas, each matrix area including a processing matrix $H_i$, a connecting matrix $A_i$, and a triangular matrix $H_p$.

The coded transmission signal S11 including all the code words is sent over the data transmission channel 7 to the second entity 5, which therefore receives a coded reception signal S7 comprising a distorted version of the coded transmission signal S11. In fact, because of propagation phenomena, the code words are severely distorted. When that happens, the data transmission channel 7 behaves like a nondeterministic distorting application between the coded transmission signal S11 at the input of the channel 7 and the coded reception signal S7 at the output of the channel 7.

To compensate the effects of propagation, the decoder device 13 calculates a best estimate of all the code words to form an estimated code signal S17 including a set of estimated code words.

In fact, the decoder device 13 can include first decoder means 17 intended to decode the coded reception signal S7 derived from the coded transmission signal S11 including all the code words according to the LDPC code constructed according to the parity check matrix H to form the estimated code signal S17.

The decoder device 13 can include second decoder means 19 intended to calculate from all the estimated cost words a best evaluation of all the data sequences sent by the information source 9 so that the receiver 15 receives an estimated information signal S19 as close as possible to the information signal S9 sent by the information source 9.

The following description is more particularly concerned with the construction of the parity check matrix H, the use of that matrix in the coding and decoding methods, and the implementation of those methods.

According to the invention, the parity check matrix H includes two matrix areas that can be two matrix rows. For example, the parity check matrix H can be divided into two matrix rows and a plurality of matrix columns so that each element is itself a matrix (to be more precise a submatrix). Under such circumstances, each matrix row includes at least one processing matrix $H_i$, a connecting matrix $A_i$, a null matrix 0, and a triangular matrix $H_p$.

In particular, over a first portion of these two matrix rows, the processing matrix $H_i$ and the connecting matrix $A_i$ are disposed alternately to form a projection matrix or block corresponding to the information bits. Also, over the other portion of these two matrix rows, the null matrix 0 and the triangular matrix $H_p$ form another block corresponding to the parity bits. This parity check matrix H can therefore be defined as follows:

$$H = \begin{bmatrix} A_1 & \ldots & H_{i-1} & A_i & H_p & 0 \\ H_i & \ldots & A_{i-1} & H_i & 0 & H_p \end{bmatrix}$$

This configuration enables the processing matrices $H_i$ to code the data sequence in as parallel a manner as possible.

Each processing matrix $H_i$ preferably has a structured form enabling fast calculation. Note that the processing matrices $H_i$ can be identical.

Also, the connecting matrices $A_i$ couple the various codes produced in parallel in order to mix them and consequently enhance the performance of the code. Note that each connecting matrix $A_i$ includes only one "1" per column and only one "1" per row. Also, these connecting matrices $A_i$ can be identical.

Furthermore, and in order to reduce the amount of data in the parity check matrix H, the connecting matrices $A_i$ can be identity matrices.

Note that the parity bits can still be calculated in a parallel manner if the connecting matrices $A_i$ are null matrices, since the decoding of the global code can then be seen as the independent decoding of a plurality of smaller subcodes. The larger the code, the better the performance. Thus making the subcodes interdependent improves performance.

Finally, the triangular shapes of the matrices $H_p$ associated with the parity bits enable fast calculation of those parity bits. These triangular matrices $H_p$ are preferably bidiagonal matrices.

Thus by expanding the parity check matrix H, each column of that matrix defines a determined number of coded bits and each row defines a parity equation.

The parity check matrix H defined above can be produced by concatenating a projection block corresponding to the information bits originally including two processing matrices and two connecting matrices so that the information block can be expanded for the same number of parity bits.

This novel structure therefore provides flexibility at the block size level in respect of the length of the code or the yield. Note also that to obtain a shorter code it is sufficient to use one of the two subcodes defined by matrices $H=\lfloor H_1\ H_p \rfloor$ or $H=\lfloor H_2\ H_p \rfloor$ on its own.

In terms of performance, the structure of the parity check matrix H defined above can exceed the performance of other LDPC codes of equal size and similar decoding complexity. To achieve such performance it is advantageous to choose each processing matrix carefully or to find a good connecting matrix or function. Techniques based on suppressing short cycles in the graph defined by the parity check matrix H and maximizing the minimum distance can be used.

Moreover, the yield can be increased by puncturing the parity bits. Note that a necessary condition for avoiding excessive loss of performance is to punch the parity bits so that at most only one of the variables of a parity equation is unknown.

Also, the coding block or code word can be enlarged for a given yield by expanding the parity check matrix. In other words, each "1" of the parity check matrix is replaced by a permutated identity matrix. Recursive expansion of the parity check matrix can also be used, i.e. each processing matrix constituting a projection block of order m can be replaced by a projection matrix of order m-1.

Then, in accordance with the invention, to code a data sequence C, that sequence is broken down into a set of data vectors including a determined number N of data vectors $C_1, \ldots, C_N$. The number of bits in the data sequence is a multiple of the determined number N of data vectors so that all the data vectors include the same number of bits. This breakdown can be effected block by block, alternately or in any other way.

The parity vectors $P_i$ corresponding to the data vectors $C_i$ conforming to all the parity equations $Hx^T=0^T$ defined by the parity check matrix H are determined knowing that $x^T$ corresponds to the transposed code word x formed of the data vectors $C_i$ and parity vectors $P_i$. In particular, the example of a parity check matrix H described above enables two parity vectors $P_1$ and $P_2$ to be determined.

Finally, all data vectors $C_1, \ldots, C_N$ are associated with the parity vectors $P_1$ and $P_2$ to form a code word x including a plurality of data bits and a plurality of parity bits.

Figure 2:
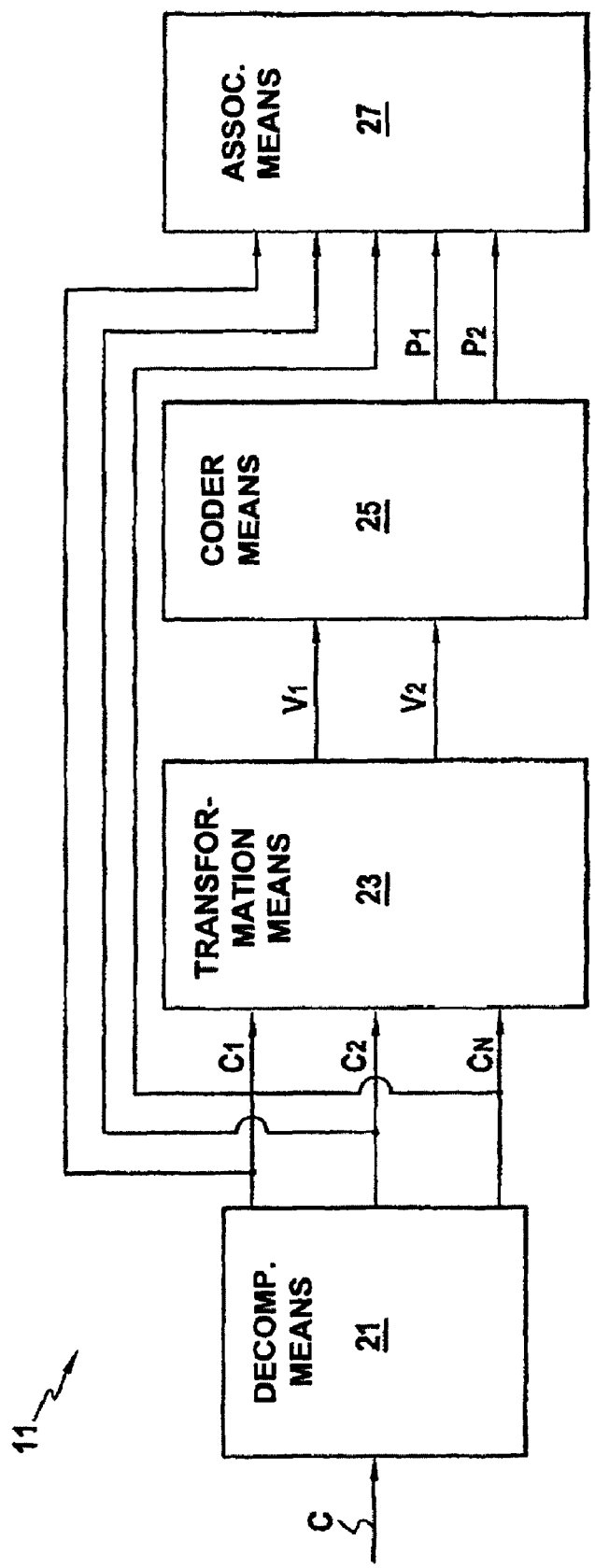
FIG. 2 is a diagram showing a coder device according to the invention using a parity check matrix.

In fact, FIG. 2 is a diagram showing a device 11 for coding a data sequence, including decomposition means 21, transformation means 23, coder means 25, and association means 27.

The decomposition means 21 are for decomposing the data sequence C into a set of data vectors $C_1, \ldots, C_N$.

The transformation means 23 and the coder means 25 are for determining the parity vectors.

In fact, the transformation means 23 are intended to use a set of parallel projections to transform all data vectors $C_1, \ldots, C_N$ into a set of projection vectors, more particularly into two projection vectors $V_1$ and $V_2$.

The coder means 25 are for multiplying each of the projection vectors $V_1$ and $V_2$ by the inverse of a triangular matrix $H_p$ of the parity check matrix H to form in particular the two parity vectors $P_1$ and $P_2$.

Finally, the association means 27 are for associating all data vectors $C_1, \ldots, C_N$ with parity vectors $P_1$ and $P_2$ to form the code word x.

Note that the coder device 11 can be implemented by a data processing system S (see FIG. 3) conventionally including a central processor unit S1 controlled by signals S2, a memory S3, an input unit S4, and an output unit S5. All the elements S1, S3, S4, and S5 are interconnected by data buses S6. Also, this data processing system can be used to execute a computer program including instructions for executing the coding method according to the invention.

By way of example, if the data sequence is decomposed into only two data vectors (first and second data vectors $C_1$ and $C_2$), the parity check matrix H includes first and second processing matrices $H_1$ and $H_2$, first and second connecting matrices $A_1$ and $A_2$, and two triangular matrices $H_p$ disposed in the following manner:

$$H = \begin{bmatrix} H_1 & A_2 & H_p & 0 \\ A_1 & H_2 & 0 & H_p \end{bmatrix}.$$

This parity check matrix H calculates the first and second parity vectors $P_1$ and $P_2$ associated with the first and second data vectors $C_1$ and $C_2$ thereby forming a code word $x=(C_1, C_2, P_1, P_2)$.

In fact, the two parity vectors $P_1$ and $P_2$ defining the code word x are obtained by calculating the solutions of the equations $H \cdot x = 0$. To be more precise, the first and second parity vectors $P_1$ and $P_2$ can be calculated in three steps using the following equations:

$$P_1^T = H_p^{-1} \cdot (H_1 \cdot C_1^T + A_2 \cdot C_2^T)$$

$$P_2^T = H_p^{-1} \cdot (H_2 \cdot C_2^T + A_1 \cdot C_1^T)$$

The first step executes first and second processing operations and first and second permutation operations on the two data vectors $C_1$ and $C_2$.

The first processing operation therefore multiplies the first data vector $C_1$ by the first processing matrix $H_1$ to form a first control vector $H_1 \cdot C_1^T$. Similarly, and in parallel, the second processing operation multiplies the second data vector $C_2$ by the second processing matrix $H_2$ to form a second control vector $H_2 \cdot C_2^T$.

The first permutation operation permutates the first data vector $C_1$ by the first connecting matrix $A_1$ to form a first permutation vector $A_1 \cdot C_1^T$. Similarly, the second permutation operation permutates the second data vector $C_2$ by the second connecting matrix $A_2$ to form a second permutation vector $A_2 \cdot C_2^T$.

The second step both adds the first control vector $H_1 \cdot C_1^T$ at the exit from the first processing operation to the second permutation vector $A_2 \cdot C_2^T$ at the exit from the second permutation operation to form a first projection vector $V_1$ and also adds the second control vector $H_2 \cdot C_2^T$ at the exit from the second processing operation to the first permutation vector $A_1 \cdot C_1^T$ at the exit from the second permutation operation to form a second projection vector $V_2$.

The third step multiplies each of the first and second projection vectors $V_1$ and $V_2$ by the inverse of a triangular matrix $H_p^{-1}$ to form in particular the two parity vectors $P_1 = H_p^{-1} V_1^T$ and $P_2 = H_p^{-1} V_2^T$.

Figure 4A:
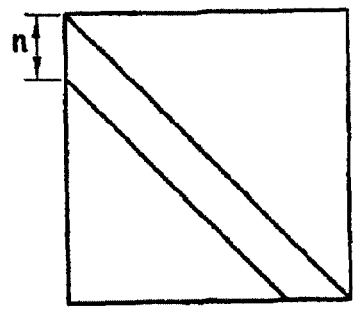
FIGS. 4A and 4B are diagrams showing examples of a triangular matrix and its inverse associated with parity bits of the parity check matrix according to the invention.

By way of example, FIG. 4A shows that this triangular matrix associated with the parity bits is advantageously a bidiagonal matrix made up of two diagonals of "1" spaced by n diagonals of "0" in the following form:

$$H_p = \begin{bmatrix} 1 & & & & & & \\ 0 & 1 & & & & & \\ \vdots & 0 & 1 & & & & \\ 0 & & 0 & 1 & & & \\ 1 & 0 & & 0 & 1 & & \\ 0 & 1 & \ddots & & \ddots & \ddots & \\ \vdots & & \ddots & 0 & & 0 & 1 \\ 0 & \ldots & 0 & 1 & 0 & \ldots & 0 & 1 \end{bmatrix}$$

Figure 4B:
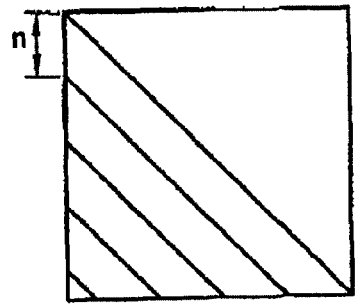

The oblique lines in FIG. 4A represent the diagonals of "1", the remainder of the matrix being equal to "0". This matrix $H_p$ can be inverted and its inverse is shown in FIG. 4B.

Figure 6:
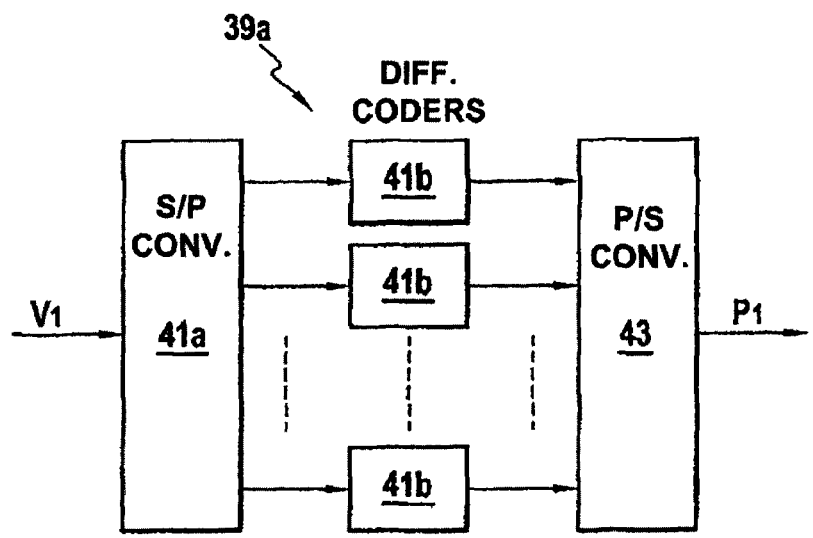
FIG. 6 is a diagram showing coder means from FIG. 5.

This type of matrix has a remarkable shape that enables fast calculation of the parity bits $p_j$ of a parity vector $P_i$ and that is easy to implement (see FIG. 6). In fact, the parity bits $p_j$ are calculated from a cumulative sum of the elements $v_j$ of a projection vector $V_i$ as follows:

$$p_j = \begin{Bmatrix} v_j & 1 \leq j \leq n+1 \\ v_j + p_{j-(n+1)} & j > n+1 \end{Bmatrix}$$

The bidiagonal construction also enables flexibility of yield by puncturing. LDPC codes in general behave very badly once punched. Puncturing the code has the consequence of adding unknowns into the parity equations. If a parity equation has more than one unknown term, it cannot be solved. Bidiagonal matrices enable efficient puncturing without excessive loss of performance. Thus it is important to punch the parity bits so that at most only one of the variables of the equation is unknown. By way of example, if n=0, effective puncturing deletes one parity bit in two.

The puncturing P1 can be effected by puncturing one parity bit in two or at random. Generally speaking, structured and appropriately chosen puncturing improves the performance of the code.

Figure 5:
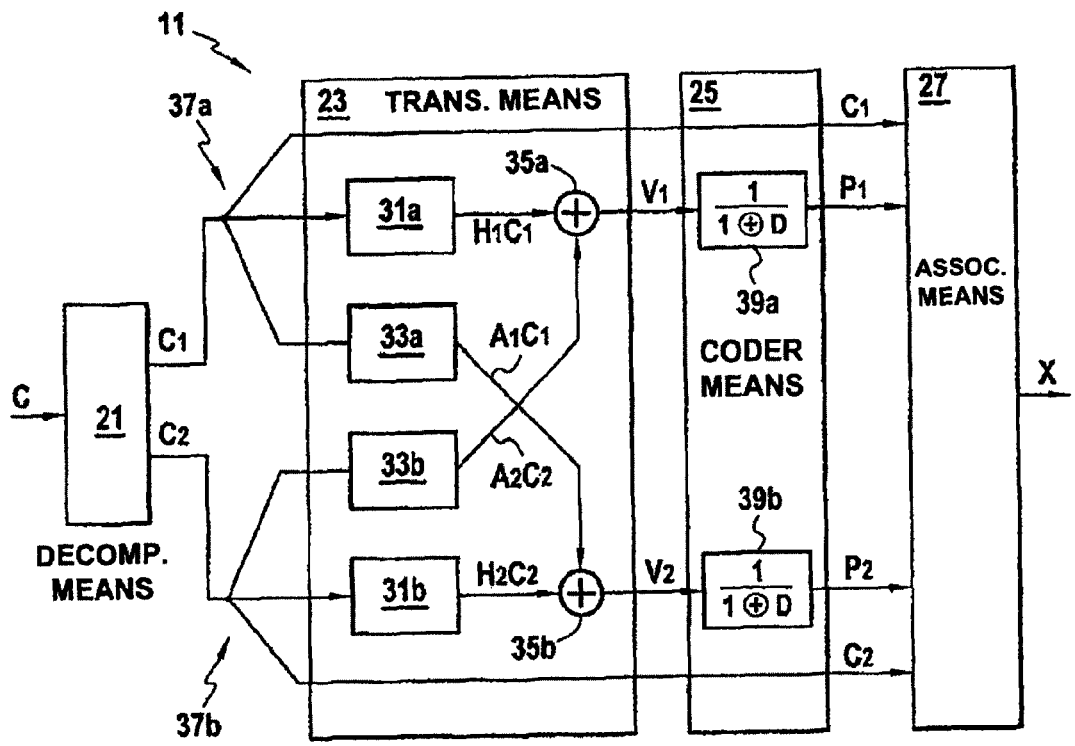
FIG. 5 is a diagram showing a FIG. 2 coder device in which the determined number of data vectors is two.

FIG. 5 shows a particular example of a coder device 11 in which the determined number of data vectors is two. This device therefore performs the above three steps and shows diagrammatically that the transformation means include control means 31a and 31b, permutation means 33a and 33b, and addition means 35a and 35b. Also, the decomposition means 21, control means 31a, 31b, permutation means 33a, 33b, addition means 35a, 35b, and association means 27 are organized into two parallel branches 37a and 37b.

Thus, in this example, the data sequence C is decomposed by the decomposition means 21 into the first and second data vectors $C_1$ and $C_2$ diverging in the first and second parallel branches 37a and 37b, respectively.

The control means 31a, 31b and the permutation means 33a, 33b are intended to carry out operations in parallel including control and permutation operations on the first and second data vectors $C_1$ and $C_2$ to form the first and second control vectors $H_1 C_1$ and $H_2 C_2$ and the first and second permutation vectors $A_1 C_1$ and $A_2 C_2$.

In fact, carrying out control operations, the control means 31a, 31b are intended to multiply in parallel on the two branches 37a and 37b each of the first and second data vectors $C_1$ and $C_2$ by a processing matrix of the parity check matrix to form the first and second control vectors $H_1 C_1$ and $H_2 C_2$, respectively.

Also, performing permutation operations, the permutation means 33a, 33b are intended to multiply in parallel on the two branches 37a and 37b each of the first and second data vectors $C_1$ and $C_2$ by a connecting matrix of the parity check matrix to form the first and second permutation vectors $A_1 C_1$ and $A_2 C_2$, respectively.

The addition means 35a, 35b are intended to add the two control vectors $H_1 C_1$ and $H_2 C_2$ to the two permutation vectors $A_2 C_1$ and $A_1 C_2$ to form the two projection vectors $V_1$ and $V_2$ in such a way that a control vector $H_1 C_1$ at the output of control means 31a acting on a data vector $C_1$ is added to a permutation vector $A_2 C_2$ at the output of permutation means 33b acting on the other data vector $C_2$. In other words, the first projection vector $V_1$ is the result of addition of the first control vector $H_1 C_1$ and the second permutation vector $A_2 C_2$ and the second projection vector $V_2$ is the result of addition of the second control vector $H_2 C_2$ and the first permutation vector $A_1 C_1$. Thus each of the control and permutation vectors is used only once.

The coder means 25 include first and second differential coders 39a and 39b for multiplying each of the first and second projection vectors $V_1$ and $V_2$ by the inverse of a bidiagonal matrix $H_p$ to form the first and second parity vectors $P_1$ and $P_2$.

FIG. 6 shows that each of the first and second differential coders 39a and 39b can include a series-parallel converter 41a and n+1 differential coders 41b (n being the space between the two diagonals of "1" of the bidiagonal matrix) and a parallel-series converter 43, therefore enabling simple calculation of the parity bits $p_j$ of a parity vector from a cumulative sum of the elements $v_j$ of a projection vector $V_i$.

Finally, the association means 27 are for associating the first and second data vectors $C_1$ and $C_2$ with the first and second parity vectors $P_1$ and $P_2$ to form the code word x.

This example therefore shows clearly that on each clock pulse two parity bits are calculated at the same time, for example, rather than one bit as in the standard structures.

A judicious choice of the connecting matrix A further reduces the memory space needed.

Figure 7:
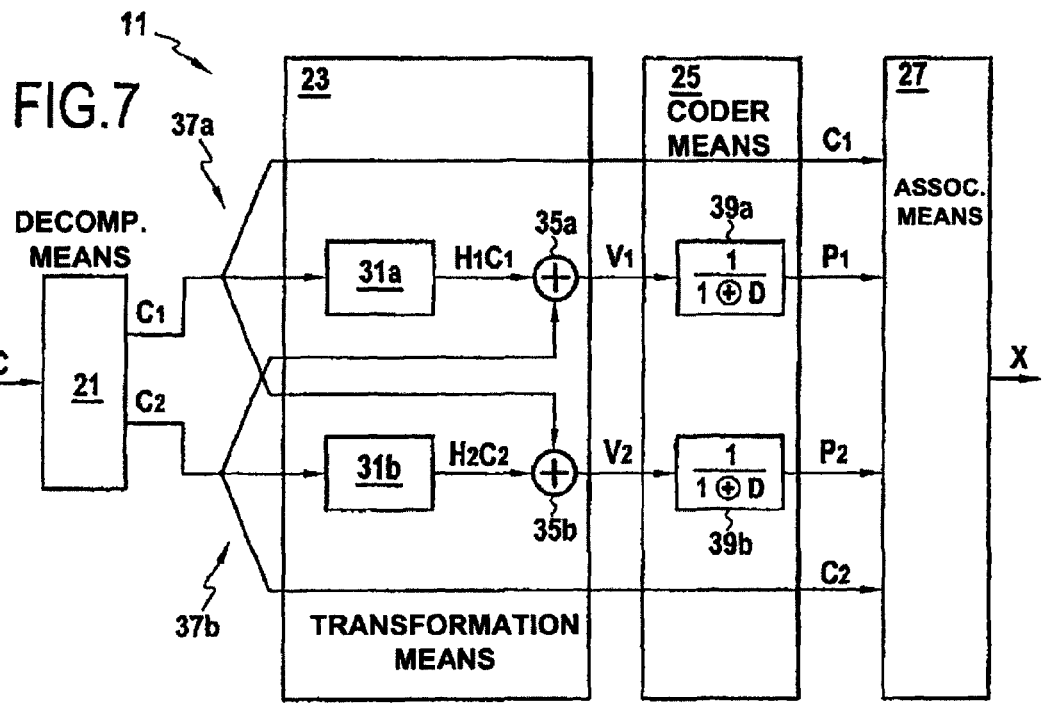
FIG. 7 shows a variant of the FIG. 5 coder device.

FIG. 7 shows a variant of the coder device from FIG. 5 that significantly reduces the coding complexity at the same time as achieving very good performance.

In fact, in this example, the parity check matrix H has the following structure:

$$H = \begin{bmatrix} H_1 & A & H_p & 0 \\ A & H_2 & 0 & H_p \end{bmatrix}$$

The processing matrices $H_1$ and $H_2$ can be matrices from the pi-rotation family proposed by R. Echard and S-C Chang in their publication "The pi rotation Low Density Parity Check Codes" (GLOBECOM 2001, November 2001, pp. 980-984). Thus a processing matrix $H_1$ can be a matrix $H_\pi$ taking the following form:

$$H_\pi = \begin{bmatrix} \pi_A & \pi_B & \pi_C & \pi_D \\ \pi_B & \pi_C & \pi_D & \pi_A \\ \pi_C & \pi_D & \pi_A & \pi_B \\ \pi_D & \pi_A & \pi_B & \pi_C \end{bmatrix}$$

$\pi_B$, $\pi_C$, and $\pi_D$ are obtained directly by rotating the matrix $\pi_A$. The matrix $\pi_B$ is obtained by 90° rotation of the matrix $\pi_A$ in the anticlockwise direction. The matrix $\pi_C$ is obtained by 90° rotation of the matrix $\pi_B$ in the anticlockwise direction, and so on. The matrix $\pi_A$ is defined by a vector giving the position of the "1" in each column. For example, $H_\pi$ can be constructed from the vector v=[1 3 2] by indexing the position of the "1" in each column, starting from the bottom, and the submatrices are therefore:

$$\pi_A = \begin{bmatrix} 0 & 1 & 0 \\ 0 & 0 & 1 \\ 1 & 0 & 0 \end{bmatrix} \quad \pi_D = \begin{bmatrix} 1 & 0 & 0 \\ 0 & 0 & 1 \\ 0 & 1 & 0 \end{bmatrix}$$

$$\pi_B = \begin{bmatrix} 0 & 1 & 0 \\ 1 & 0 & 0 \\ 0 & 0 & 1 \end{bmatrix} \quad \pi_C = \begin{bmatrix} 0 & 0 & 1 \\ 1 & 0 & 0 \\ 0 & 1 & 0 \end{bmatrix}$$

As a result, knowing $\pi_A$ enables all of the matrix $H_\pi$ to be reconstructed.

Also, the triangular matrix $H_p$ can be made bidiagonal with the parameter n equal to zero, i.e. of the form:

$$H_p = \begin{bmatrix} 1 & & & & \\ 1 & 1 & & & \\ & \ddots & \ddots & & \\ & & & 1 & 1 \\ & & & & 1 & 1 \end{bmatrix}$$

Finally, identity connecting matrices A=I can be used to obtain the simplest possible coding scheme. The calculation of the parity bits then proceeds in accordance with the following equations:

$$P_1^T = H_p^{-1} \cdot (H_1 \cdot C_1^T + C_2^T)$$

$$P_2^T = H_p^{-1} \cdot (H_2 \cdot C_2^T + C_1^T)$$

These two equations are implemented by the parallel branches 37a and 37b of the coder device.

Note that the matrices from the pi-rotation family simplify the calculation of the products $H_1 \cdot C_1^T$ and $H_2 \cdot C_2^T$ as much as possible and reduce the matrix storage space.

Thus the parameters of the code can be set using the vector [m, a, b, d, d], m corresponding to the size of the generator submatrix $\pi_4$, [a, b] to the parameters of the pi-rotation matrix $H_1$, and [c, d] to the parameters of the pi-rotation matrix $H_2$. The size of the submatrices being fixed, the parameter m relating to the size of the generator sub-matrix $\pi_A$ is deduced directly from it.

The following algorithm can then be used to obtain a good code.

Step 1: Search for the set $C_4$ of pairs [a, b] and [c, d] such that the graph defined by the parity check matrices $H=[H_1\ H_p]$ and $H=[H_2\ H_p]$ do not have short cycles and more particularly fourth order cycles. A code search algorithm with no fourth order cycle is used for this, for example.

Step 2: Search for the set $C_{44}$ of quadruplets [a, b, c, d] the pairs [a, b] and [c, d] of which are included in $C_4$ and such that the graph defined by the matrix:

$$\begin{bmatrix} H_1 & I \\ I & H_2 \end{bmatrix}$$

does not have short cycles and more particularly fourth order cycles. A code search algorithm with no fourth order cycle is used for this, for example.

Step 3: Search the quadruplets of the set $C_{44}$ for those that maximize the minimum distance of the code associated with the parity check matrix. The minimum distance search algorithm described in the publication by Xiao-Yu Hu et al "On the computation of the minimum distance of low-density parity-check codes", (ICC 2004—IEEE International Conference on Communications, vol. 27, no. 1, June 2004, pp. 767-771) is used for this purpose, for example.

The size of the information word is fixed at 60 bytes, for example. The minimum yield is fixed at 0.5. The maximum size of the block is therefore 120 bytes or 960 bits; the matrix $H_p$ is a 480×480 matrix; the matrices $H_1$ and $H_2$ are 240×240 matrices.

By applying the puncturing technique, it is possible to cover a very large number of yields from 0.5 up to 0.67. The parameter m is therefore fixed at 60 (960=2×8×m). Thus by using the algorithm described above, it is possible to obtain a code having parameters that are given by [a=13, b=14, c=59, d=52].

Remember that the advantage of this construction is simple and fast coding at the level of the first entity 3 (the sender), thereby increasing the data rate.

Expanding the structure, which also improves yield, offers lower losses. However, expansion increases the complexity of coding and decoding. A technique based both on puncturing and on expanding the structure represents the best trade-off between performance and complexity.

Generally speaking, if the determined number of data vectors is greater than two, the coding method includes the formation of a set of control vectors and a set of permutation vectors. The set of control vectors is then added to the set of permutation vectors to form a set of projection vectors.

The projection vectors of this set of projection vectors are then added two by two to form another set of projection vectors. Note that each addition of two projection vectors is effected on projection vectors that do not depend on the same data vectors.

Furthermore, if this other set of projection vectors still includes more than two projection vectors, two by two addition of the projection vectors of this other set of projection vectors is repeated, iteratively, until two projection vectors are obtained.

In fact, FIG. 8 shows another example of a coder device 11 in which the determined number of data vectors is four (i.e. a first data vector $C_1$, a second data vector $C_2$, a third data vector $C_3$, and a fourth data vector $C_4$). The parity equations are then obtained by solving the following matrix equation:

$$\begin{bmatrix} A_1 & H_2 & A_3 & H_4 & H_p & 0 \\ H_1 & A_2 & H_3 & A_4 & 0 & H_p \end{bmatrix} \cdot \begin{bmatrix} C_1 \\ C_2 \\ C_3 \\ C_4 \\ P_1 \\ P_2 \end{bmatrix} = 0$$

This example shows that the transformation means 23 of the coder device include control means 31a to 31d, permutation means 33a to 33d, first addition means 35a to 35d, and second addition means 45a and 45b.

The control means 31a to 31d, carrying out control operations, multiply in parallel each data vector $C_i$ by a processing matrix $H_p$ of the parity check matrix to form a set of control vectors (i.e. a first control vector $H_1C_1$, a second control vector $H_2C_2$, a third control vector $H_3C_3$, and a fourth control vector $H_4C_4$).

The permutation means 33a to 33d, carrying out permutation operations, multiply in parallel each data vector $C_i$ by a connecting matrix $A_i$ of the parity check matrix H to form a set of permutation vectors (i.e. a first permutation vector $A_1C_1$, a second permutation vector $A_2C_2$, a third permutation vector $A_3C_3$, and a fourth permutation vector $A_4C_4$).

The first addition means 35a to 35d add the set of control vectors to the set of permutation vectors to form a set of projection vectors such that a control vector at the output of control means acting on any data vector is added to a permutation vector at the output of permutation means acting on another data vector. Note that when forming the set of projection vectors, each permutation vector from the set of permutation vectors is used only once.

In other words, the first control vector $H_1C_1$ is added to the second permutation vector $A_2C_2$ to form a first projection vector $V_{12}$ depending on the first and second data vectors. The second control vector $H_2C_2$ is added to the first permutation vector $A_1C_1$ to form a second projection vector $V_{21}$ depending on the first and second data vectors. The third control vector $H_3C_3$ is added to the fourth permutation vector $A_4C_4$ to form a third projection vector $V_{34}$ depending on the third and fourth data vectors. Finally, the fourth control vector $H_4C_4$ is added to the third permutation vector $A_3C_3$ to form a fourth projection vector $V_{43}$ depending on the third and fourth data vectors.

Finally, the second addition means 45a and 45b add the first projection vector $V_{12}$ to the third projection vector $V_{34}$ and the second projection vector $V_{21}$ to the fourth projection vector $V_{43}$ to form the two projection vectors $V_1$ and $V_2$ that are used by the coder means 25 to form the two parity vectors $P_1$ and $P_2$.

Of course, if the determined number of data vectors is greater than four, other second addition means successively add two by two the projection vectors from the set of projection vectors until only two projection vectors are obtained.

Thus the coder device according to the invention determines parity vectors respecting the parity equations defined by the parity check matrix.

In particular, a computer program including instructions necessary for executing the coding method can be implemented in the decomposition means and/or transformation means and/or coder means and/or association means of the coder device.

Figure 9:
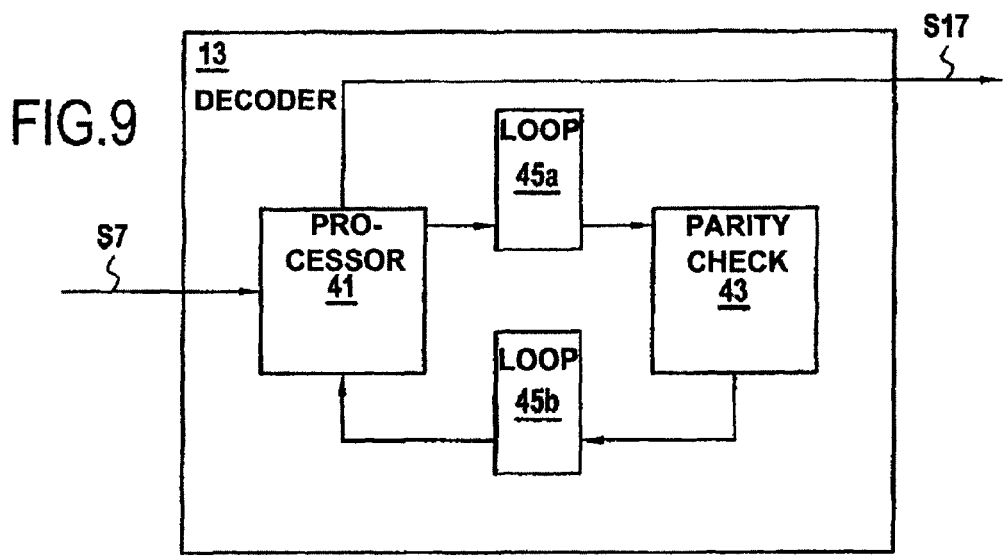
FIG. 9 is a diagram showing a decoder device of the invention using the parity check matrix.
Figure 10:
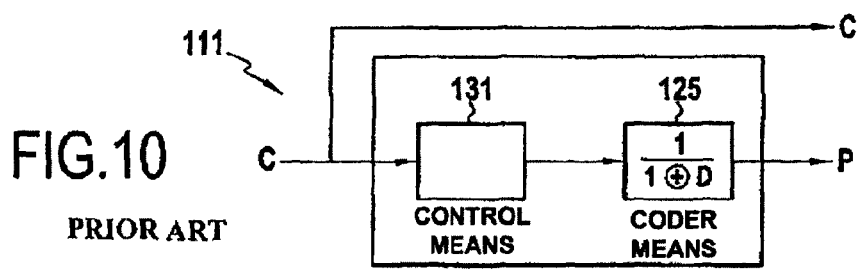
FIG. 10 is a diagram showing a prior art decoder device.

FIG. 9 shows a device 13 according to the invention for decoding a coded reception signal S7 including coded bits. This coded reception signal S7 is derived from a set of code words constructed in accordance with the parity check matrix H.

The decoder device 13 includes processor means 41 connected to parity check modules 43 by first and second looping means 45a and 45b. The first looping means 45a execute a permutation function and the second looping means 45b execute an inverse permutation function thereby enabling iterative propagation of information between the processor means 41 and the parity check modules 43.

The processor means 41 receive the values of the coded bits constituting the coded reception signal S7. In fact, the processor means 41 solve the parity equations associated with the parity check matrix to calculate probabilistic estimates of the values of the coded bits participating in each of these parity equations.

Note that solving the parity equations enables relations to be established between the parity equations and the coded bits in the form of a Tanner graph. Thus decoding can be effected iteratively by propagating messages between different levels of a tree formed by the iteration process acting on the Tanner graph.

In fact, the probabilistic estimates calculated by the processor means 41 are sent to the parity check modules 43 via the first looping means 45a.

Each of the parity check modules 43 processes the coded bits iteratively and communicates with the other modules 43 to exchange messages or probabilistic estimates, thus enabling the processor means 41 to calculate on each iteration and for each coded bit a new probabilistic estimate and to update the probabilistic estimate at the level of the parity equations until a predetermined stop condition is satisfied.

When the stop condition is satisfied, the processor means 41 send a signal including the estimated code words. Note that this stop condition can be defined by a determined number of iterations and/or by convergence of decoding toward a code word.

Figure 3:
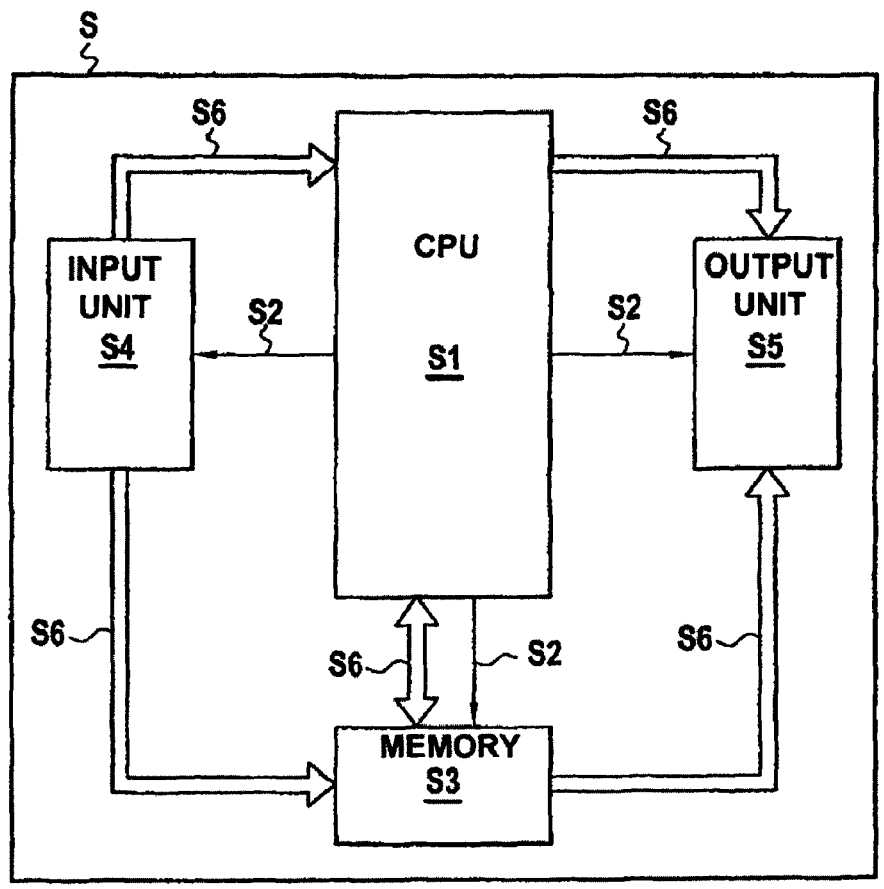
FIG. 3 is a diagram showing a data processing system.

Note that the decoder device 13 can be implemented by a data processing system S like that shown in FIG. 3. Moreover, that data processing system can be used to execute a computer program including instructions for executing the decoding method of the invention.

For example, the decoding algorithm can be decomposed iteratively in three steps.

The first step concerns solving the parity equations. In fact, each row of the parity check matrix H defines a parity check equation such as $H \cdot \tilde{c}^T = 0$, where $\tilde{c}$ are the weighted estimates received at the decoder. Solving each equation provides information on the variables in it. The variables participating in parity equation i are given by the non-null elements of H(i,j), where H(i,j) is the element of the $i^{th}$ row and $j^{th}$ column of the parity check matrix H. Solving the $i^{th}$ row enables calculation of the messages $m_{i,j}$ sent to the set of variables connected to that equation in the following manner:

$$m_{i,j} = 2 \tanh^{-1} \prod_{n \in W/j} \tanh\left(\frac{v_{n,j}}{2}\right)$$

where $v_{n,j}$ represents the message of the variable n to the parity check equation i.

The second step of the algorithm collects the information coming from the various parity check equations for each variable j. The a posteriori value of each variable is equal to the sum of all the messages coming from the various parity equations. The set E of parity equations involving the variable j is given by the non-null elements of H(i,j). That sum is equal to:

$$v_j = u_j^0 + \sum_{n \in E_j} m_{n,j}$$

where $u_j^0$ is the likelihood ratio of the variable j observed at the channel output. Using the a posteriori value $v_j$, a decision is taken on the binary value of each variable:

$$\tilde{v}_j = \frac{1 - \text{sign}(v_j)}{2}$$

considering a constellation formation of the form 0000→1 and 1→−1.

The third step calculates the messages sent to each parity equation including this variable. This message $v_{j,i}$, from the variable j to the equation i, is calculated using the following equation:

$$v_{j,i} = v_j - m_{i,j}$$

These three steps are repeated until the stop condition is satisfied, in other words until the maximum iteration number is reached or decoding has converged toward a code word and the equation $H \cdot c^T = 0$ is satisfied.

Note that LDPC codes can equally well be decoded by other iterative algorithms based on approximations of the above algorithm, for example the BP-based algorithm (or mini-sum algorithm), the APP algorithm, the APP-based algorithm, the λ-min algorithm, the A-min* algorithm, etc.

The structure of the parity check matrix according to the invention thus enables simple and fast coding through parallel calculation and also simple decoding. Moreover, in performance terms, the decoder constructed in this way achieves performance in terms of bit error rates comparable with or even better than that of other standard LDPC codes. Finally, note the flexibility in terms of size and yield offered by this construction.

The invention claimed is:

1. A method, implemented in a coder device, of constructing an LDPC code parity check matrix, comprising the steps of:

arranging each column of said parity check matrix to define a determined number of coded bits, including information bits and parity bits, and each row of said parity check matrix to define a parity equation, and arranging said parity check matrix to include at least two matrix rows, each element of a matrix row being a matrix, and each matrix row including:
(i) at least one processing matrix and one connection matrix having only one "1" per column and one "1" per row, and
(ii) a null matrix and a triangular matrix,
wherein said at least one processing matrix and one connection matrix are arranged to form a block corresponding to the information bits, and said null matrix and said triangular matrix are arranged to form another block corresponding to the parity bits.

2. The method of coding a data sequence in accordance with an LDPC code constructed according to claim 1, comprising the steps of:
decomposing the data sequence into a set of data vectors including a determined number of data vectors;
determining parity vectors corresponding to the data vectors satisfying the set of parity equations defined by said parity check matrix; and
associating the set of data vectors with the parity vectors to form a code word including a plurality of data bits and a plurality of parity bits.

3. The coding method according to claim 2, wherein the step of determining said parity vectors includes the steps:
transforming said set of data vectors into projection vectors by means of a set of projections in parallel; and
multiplying each of the projection vectors by the inverse of a triangular matrix of said parity check matrix to form said parity vectors.

4. The method according to claim 3, wherein the determined number of data vectors is two, and said parallel projection transformation step includes the steps of:
carrying out operations in parallel including control and permutation operations on said two data vectors to form two control vectors and two permutation vectors; and
adding said two control vectors to said two permutation vectors to form a set of projection vectors consisting of said two projection vectors so that a control vector at the exit from an operation of checking a data vector is added to a permutation vector at the exit from an operation of permutating the other data vector.

5. The method according to claim 4, wherein each permutation vector of said set of permutation vectors is used only once during the formation of said set of projection vectors.

6. The method according to claim 4, wherein said control information includes multiplying each data vector by a processing matrix of said parity check matrix and in that said permutation operation includes multiplying each data vector by a connecting matrix of said parity check matrix.

7. The method according to claim 6, wherein the connecting matrices of said parity check matrix are identical.

8. The method according to claim 7, wherein the connecting matrices are identity matrices.

9. The method according to claim 3, wherein the determined number of data vectors is greater than two, and said parallel projection transformation step includes the steps of:
carrying out operations in parallel including control and permutation operations on said set of data vectors to form a set of control vectors and a set of permutation vectors;
adding said set of control vectors to said set of permutation vectors to form a set of projection vectors such that a control vector at the exit from an operation of checking any data vector is added to a permutation vector at the exit from an operation of permutating another data vector;

adding the projection vectors of said set of projection vectors two by two to form another set of projection vectors, the addition being effected between two projection vectors that do not depend on the same data vectors; and
if the other set of projection vectors includes more than two projection vectors, repeating the previous step until said two projection vectors are obtained.

10. The method according to claim 2, further comprising a step of puncturing parity bits of said code word.

11. A non-transitory computer-readable medium comprising a computer program implemented in a data processing system, the computer program including instructions necessary for carrying out the coding method according to claim 2.

12. The method according to claim 1, wherein the triangular matrix is a bidiagonal matrix including two diagonals of "1" spaced by a given number n of diagonals of "0".

13. A device for coding a data sequence in accordance with an LDPC code constructed in accordance with claim 1, comprising:
means (21) for decomposing the data sequence into a set of data vectors including a determined number of data vectors;
transformation means (23) for transforming said set of data vectors into projection vectors by means of a set of projections in parallel;
coder means (25) for multiplying each of the projection vectors by the inverse of said triangular matrix of said parity check matrix to form two parity vectors; and
association means (27) for associating the set of data vectors with said parity vectors to form a code word including a plurality of data bits and a plurality of parity bits.

14. The device according to claim 13, wherein the determined number of data vectors is two, and the transformation means (23) include:
control means (31a, 31b) for multiplying in parallel each of the two data vectors by a processing matrix of said parity check matrix forming two control vectors;
permutation means (33a, 33b) for multiplying in parallel each of the two data vectors by a connecting matrix of said parity check matrix forming two permutation vectors; and
addition means (35a, 35b) for adding said two control vectors to said two permutation vectors to form said two projection vectors such that a control vector at the output of control means acting on a data vector is added to a permutation vector at the output of permutation means acting on the other data vector.

15. The device according to claim 13, wherein the determined number of data vectors is greater than two, and the transformation means (23) include:
control means (31a to 31d) for multiplying in parallel each data vector by a processing matrix of said parity check matrix forming a set of control vectors;
permutation means (33a to 33d) for multiplying in parallel each data vector by a connecting matrix of said parity check matrix forming a set of permutation vectors;
first addition means (35a to 35d) for adding said set of control vectors to said set of permutation vectors to form a set of projection vectors such that a control vector at the output of control means acting on any data vector is added to a permutation vector at the output of permutation means acting on another data vector; and
second addition means (45a, 45b) for successively adding the projection vectors from the set of projection vectors two by two until two projection vectors are obtained.

16. A method of decoding a reception signal including coded bits, said reception signal being derived from a set of code words coded in accordance with the LDPC code constructed in accordance with claim 1, comprising the steps of:

solving each of said parity equations associated with said parity check matrix to calculate probabilistic estimates of the values of decoded bits in each of said parity equations;

sending said probabilistic estimates to the set of coded bits in each of said parity equations;

calculating for each coded bit a new probabilistic estimate from the probabilistic estimates obtained from the parity equations associated with each coded bit;

updating the probabilistic estimates at the level of the parity equations; and reiterating the above steps until a predetermined stop condition is satisfied.

17. The decoding method according to claim 16, wherein the predetermined stop condition is defined by a determined number of iterations and/or by the decoding process converging toward a code word.

18. A non-transitory computer-readable medium comprising a computer program implemented in a data processing system, the computer program including instructions necessary for carrying out the decoding method according to claim 16.

19. A device for decoding a reception signal that includes coded bits and is obtained from a set of code words constructed in accordance with claim 1, comprising:

processor means (41) for solving each of said parity equations associated with said parity check matrix to calculate probabilistic estimates of the values of decoded bits in each of said parity equations; and parity check modules (43) each iteratively processing decoded bits and communicating with the other modules to exchange the probabilistic estimates enabling the processor means (41) to calculate a new probabilistic estimate on each iteration and for each coded bit until a predetermined stop condition is satisfied.

20. A communication system including a first entity (3) comprising an information source (9) and a coder device (11) connected by a data transmission channel (7) to a second entity (5) including a decoder device (13), wherein the coder device (11) codes a data sequence sent by the information source (9) to form a set of code words from a parity check matrix, and the decoder device (13) decodes a coded reception signal that is received by the second entity and is obtained from the set of code words constructed in accordance with said parity check matrix, and wherein said parity check matrix is constructed by the steps of:

arranging each column of said parity check matrix to define a determined number of coded bits, including information bits and parity bits, and each row of said parity check matrix to define a parity equation, and arranging said parity check matrix to include at least two matrix rows, each element of a matrix row being a matrix, and each matrix row including:

(i) at least one processing matrix and one connection matrix having only one "1" per column and one "1" per row, and (ii) a null matrix and a triangular matrix, wherein said at least one processing matrix and one connection matrix are arranged to form a block corresponding to the information bits, and said null matrix and said triangular matrix are arranged to form another block corresponding to the parity bits.

\* \* \* \* \*